(12) United States Patent
Ghosh Dastidar et al.

(10) Patent No.: US 8,516,322 B1
(45) Date of Patent: Aug. 20, 2013

(54) AUTOMATIC TEST PATTERN GENERATION SYSTEM FOR PROGRAMMABLE LOGIC DEVICES

(75) Inventors: Jayabrata Ghosh Dastidar, Santa Clara, CA (US); Alok Shreekant Doshi, Sunnyvale, CA (US); Binh Vo, Los Gatos, CA (US); Kalyana Ravindra Kantipudi, Sunnyvale, CA (US); Sergey Timokhin, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 277 days.

(21) Appl. No.: 12/568,136

(22) Filed: Sep. 28, 2009

(51) Int. Cl.
*G01R 31/3183* (2006.01)
*G01R 31/40* (2006.01)

(52) U.S. Cl.
USPC .......................................... 714/738; 714/725

(58) Field of Classification Search
None
See application file for complete search history.

(56) References Cited

U.S. PATENT DOCUMENTS

| | | | |
|---|---|---|---|
| 4,862,399 A * | 8/1989 | Freeman | 714/738 |
| 5,633,813 A | 5/1997 | Srinivasan | |
| 5,862,149 A | 1/1999 | Carpenter | |
| 6,108,806 A | 8/2000 | Abramovici | |
| 6,256,758 B1 * | 7/2001 | Abramovici et al. | 714/724 |
| 6,550,030 B1 * | 4/2003 | Abramovici et al. | 714/725 |
| 6,567,934 B1 * | 5/2003 | Yen et al. | 714/33 |
| 7,139,955 B2 | 11/2006 | Rohrbaugh | |
| 7,373,621 B1 * | 5/2008 | Dastidar | 714/726 |
| 2002/0073380 A1 * | 6/2002 | Cooke et al. | 716/1 |
| 2003/0076723 A1 * | 4/2003 | Zarrineh et al. | 365/201 |
| 2009/0138770 A1 * | 5/2009 | Nakaya | 714/725 |

* cited by examiner

*Primary Examiner* — Ajay Bhatia
*Assistant Examiner* — Dipakkumar Gandhi
(74) *Attorney, Agent, or Firm* — Treyz Law Group; G. Victor Treyz; Nancy Y. Ru

(57) ABSTRACT

A programmable integrated circuit may contain multiple logic blocks. Computing equipment may be used to run automated tools that process a design for the programmable integrated circuit to perform corresponding circuit tests. A translation tool may translate a transistor-level description of circuitry on the programmable integrated circuit into a gate-level description. A block-level test configuration data generation tool may generate block-level test configuration data files. The test configuration data files may be used as constraints for an automatic test pattern generation tool that produces block-level test vectors. A full-chip propagation tool may use the block-level test vectors, block-level test configuration data files, and full-chip constraints to produce corresponding full-chip test configuration data and full-chip test vectors for testing the integrated circuit. A translation tool may convert the configuration data and test vectors into a tester file.

19 Claims, 3 Drawing Sheets

AUTOMATIC TEST PATTERN GENERATION SYSTEM FOR PROGRAMMABLE LOGIC DEVICES

BACKGROUND

This invention relates to integrated circuits, and more particularly, to testing integrated circuits such as programmable integrated circuits.

Conventional automatic test pattern generation tools are available for testing application-specific integrated circuits. These tools use information on the design of a circuit under test to create patterns of test signals. A test apparatus may be used to apply the test patterns to the circuit under test and may be used to gather corresponding test results. Because automatic test pattern generation tools are able to generate test patterns automatically with minimal need for manual control, it is possible to rapidly generate test patterns for complex application-specific integrated circuits.

Integrated circuits with programmable logic can be difficult or impossible to test thoroughly in this way. A typical programmable integrated circuit contains programmable elements that are loaded with configuration data. The values of the configuration data bits that are loaded into the programmable elements determine the values of corresponding static control signals that are produced by the programmable elements during operation of the integrated circuit. The static control signals are applied to programmable logic components such as transistors. This configures the programmable logic on the programmable integrated circuit to perform a desired custom logic function.

The programmable nature of programmable integrated circuits makes programmable integrated circuits suitable for circuit applications in which there is insufficient time available to design and debug a full custom design for a hardwired integrated circuit. However, because programmable integrated circuits can be configured in more than one way by loading different configuration data, the way in which a programmable integrated circuit will operate during testing is difficult to specify. Proper test pattern generation requires the identification of suitable test patterns to test the programmable integrated circuit in numerous configurations. For example, if a programmable integrated circuit contains programmable logic that can be configured to route a selected one of multiple clock signals to a given circuit, it may be necessary to perform tests on the programmable integrated circuit that take account of each of the possible clock settings for the integrated circuit.

When testing programmable circuits such as programmable logic device integrated circuits, substantial manual intervention is required. This is because conventional automatic test pattern generation tools are incapable of processing programmable logic device design files to produce test patterns for testing programmable logic devices.

With conventional arrangements, test personnel manually inspect programmable integrated circuit design files to attempt to identify which logic configurations should be used during testing. For integrated circuits that contain numerous repetitive circuit blocks, it is also necessary for test personnel to manually construct chip-level test files from information on the circuit blocks. Although custom test building code is sometimes used to assist test personnel in performing these manual processes, there is no satisfactory way to automatically generate test patterns for testing programmable integrated circuits. Programmable integrated circuit testing therefore remains difficult and error prone.

It would therefore be desirable to be able to provide improved and automated ways in which to test integrated circuits such as programmable integrated circuits.

SUMMARY

A programmable integrated circuit may contain multiple blocks of programmable logic. Programmable resources such as clock-selection multiplexers and buses may be used to route clock signals and other signals among programmable logic blocks.

A block-level test configuration data generation tool may produce block-level test configuration data files from a gate-level description of the programmable integrated circuit. In producing the block-level test configuration data files, the block-level test configuration data generation tool may take account of block-level constraints such as information on which clocks are available in the programmable integrated circuit, information on which scan chain control signals are to be used in testing, etc.

The block-level test configuration data files may be used as constraints and the gate-level description may be used as automatic test pattern generation input. An automatic test pattern generation tool may produce block-level test vectors based on the automatic test pattern generation constraints. The automatic test pattern generation tool may also generate a coverage report.

The block-level test vectors may include, at the level of a given one of the programmable logic blocks, input test vectors to be applied to test the blocks and output test vectors that represent expected data values corresponding to the input test vectors.

A full-chip propagation tool may automatically produce full-chip test configuration data and full-chip test vectors using the block-level vectors and full-chip constraints. The full-chip test configuration data and full-chip vectors can be processed by a conversion tool to produce a tester file.

A tester may use the tester file to test the programmable integrated circuit. During testing, the full-chip test configuration data is used to configure all of the blocks of circuitry on the programmable logic device for testing. In certain configurations, some of the blocks may be configured as circuits under test, whereas other blocks may be configured as observation blocks. Direct connections between blocks such as carry signal paths may be exploited during testing.

Test input vectors may be applied to a programmable integrated circuit that has been configured by the full-chip test configuration data using input-output pins and scan chain registers. Corresponding test output vectors can be gathered using the input-output pins and using the scan registers. Test results can be analyzed using the tester or other computing equipment.

Further features of the invention, its nature and various advantages will be more apparent from the accompanying drawings and the following detailed description of the preferred embodiments.

DETAILED DESCRIPTION

Automatic test pattern generation tools are commercially available for testing hardwired custom integrated circuits (sometimes referred to as application-specific integrated circuits). These tools are generally incapable of automatically generating test patterns for testing programmable integrated circuits. For example, conventional automatic test pattern generation tools cannot handle circuits with that contain numerous repeating blocks of programmable logic.

Figure 1:
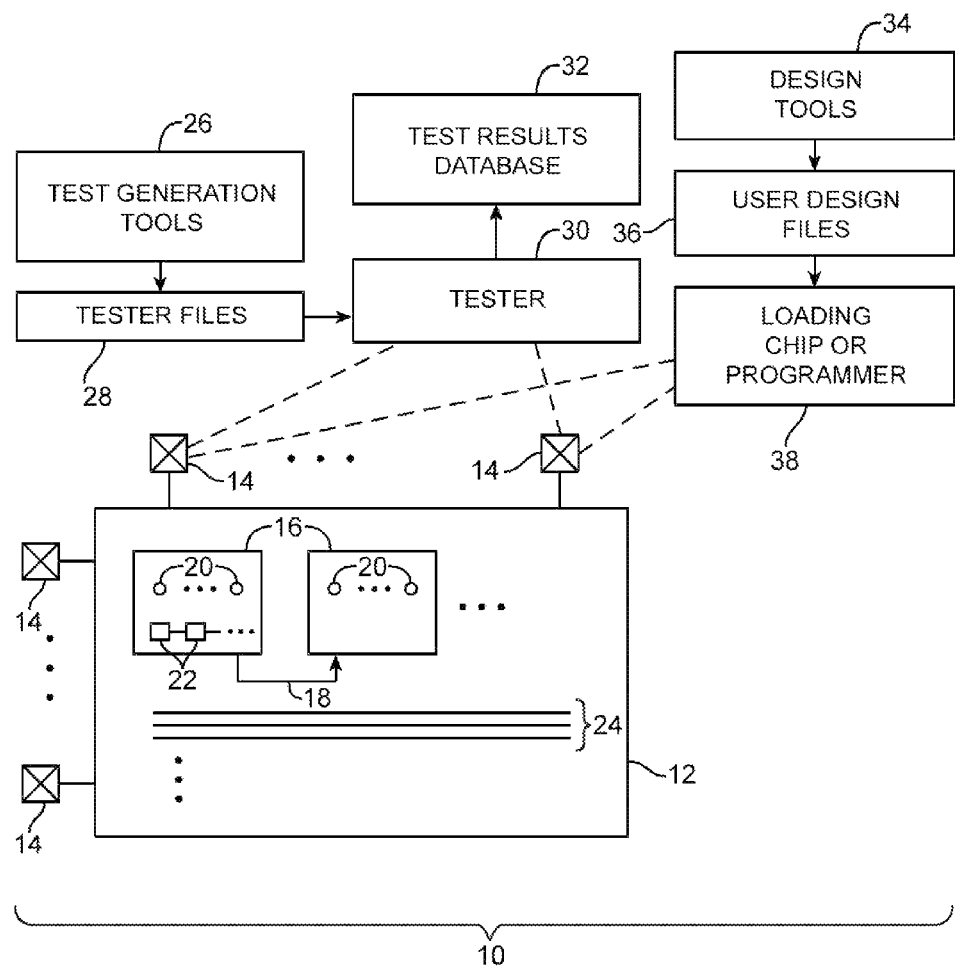
FIG. 1 is a diagram of an illustrative system in which integrated circuits such as programmable integrated circuits may be tested in accordance with an embodiment of the present invention.

A system in which test patterns for testing programmable logic may be automatically generated in accordance with an embodiment of the present invention is shown in FIG. 1. As shown in FIG. 1, system 10 may include a programmable integrated circuit 12 that is tested using tester 30. Because integrated circuit 12 is being tested by tester 30, integrated circuit 12 may sometimes be referred to as the integrated circuit under test ("CUT") or device under test ("DUT").

Test generation tools 26 may automatically generate tester files 28 for use by tester 30. Tester 30 may be implemented using testing code that runs on a Windows® platform or on other suitable computing equipment (e.g., computing equipment 40 of FIG. 2). Tester 30 may use tester files 28 in determining how to program integrated circuit 12 for testing and in determining which test vectors to apply to integrated circuit 12. Tester 30 may also use tester files 28 in evaluating whether the resulting output signals that are produced by circuit 12 during testing have expected values. If the signals that are produced by integrated circuit 12 do not match the expected values, tester 30 can conclude that integrated circuit 12 contains a fault. Test analysis operations on the measured test signals may be performed to produce reports and other test results. The test results may be stored in storage in system 10. For example, tester 30 may store test results in one or more databases such as test results database 32.

Following satisfactory testing and debugging operations, programmable integrated circuit 12 may be configured ("programmed"). During configuration operations, configuration data (also sometimes referred to as "programming data") may be loaded into device 12 using a configuration integrated circuit or a programmer. This configuration data loading circuitry is represented by programmer 38 in the example of FIG. 1.

The configuration data that is loaded into integrated circuit 12 represents a custom logic design. Once loaded with the configuration data, the programmable logic circuits within integrated circuit 12 will perform the custom logic functions and can be used in a system.

Computer-aided design (CAD) tools 34 may be used in producing a custom logic design. A logic designer at tools 34 may supply design criteria using any suitable user interface. For example, tools 34 may supply a logic designer with selectable on-screen options and text boxes that allow a user to enter design specifications. Tools 34 may also allow a user to retrieve designs from a design library. If desired, users may supply design specifications in the form of hardware description language code. Design editing features may be provided by tools 34 to allow a user to modify designs. Design specifications may include functional descriptions of circuit operations and design constraints such as limits on clock rates, power consumption requirements, critical path timing constraints, layout constraints, etc.

Once design entry by a logic designer or other user is complete, tools 34 may produce a corresponding set of one or more configuration data files 36 (e.g., *.pof or *.sof files). A configuration data file defines the pattern of configuration bits that are used in programming a programmable integrated circuit. When producing the configuration data file(s) 36, tool(s) 34 may take into account the particular resources that are available in the programmable logic integrated circuit into which the user design is to be implemented. For example, if a desired custom logic design requires the use of a multiplier, tools 34 can implement the multiplier using a hardwired multiplier block on circuit 12 if such a hardwired multiplier block is available. If the hardwired multiplier block is not available on the type of programmable integrated circuit that is being used to implement the custom design, tools 34 can determine which available resources are to be used in implementing the multiplier.

Configuration data may be loaded into integrated circuit 12 through pins 14. Pins 14 may be used for supplying power supply signals for integrated circuit 12. Pins 14 may also be used as input-output pins (e.g., to convey data signals into and out of integrated circuit 12). During configuration data loading operations, one or more pins 14 may be configured as data loading pins. Loaded data may be read out of integrated circuit 12 following device programming to ensure that the loaded data is error free.

Integrated circuit 12 may contain programmable logic such as programmable logic blocks 16. Programmable interconnects such as bus 24 may be used to interconnect the circuitry of blocks 16 and input-output circuitry on integrated circuit 12. There may be any suitable number of circuit blocks 16 in integrated circuit 12. For example, there may be tens, hundreds, thousands, or more than thousands of blocks 16. Blocks 16 may, if desired, include smaller circuits. For example, blocks 16 may be somewhat larger blocks of the type sometimes referred to as logic array blocks each of which includes numerous smaller blocks of circuitry of the type sometimes referred to as logic elements or logic regions.

As shown in FIG. 1, programmable integrated circuit 12 may include programmable elements 20. Programmable elements 20 may be based on volatile memory elements such as random-access-memory (RAM) cells or nonvolatile memory elements. During data loading operations, configuration data (i.e., from files 36) is loaded into programmable elements 20. Accordingly, RAM-based programmable elements 20 are sometimes referred to as configuration RAM or CRAM.

Each programmable element 20 supplies a static output control signal that controls a gate or other control terminal of a metal-oxide-semiconductor transistor or other programmable logic component. The state of the static output signal reflects the state of the configuration bit that is stored in the programmable element. If, for example, a programmable element is loaded with a logic one, the output of that programmable element will be high (as an example). If this high signal is applied to the gate of an n-channel metal-oxide-semiconductor transistor (e.g., in a multiplexer or other logic gate), the transistor will be turned on. If, on the other hand, the programmable element is loaded with a logic zero, the programmable element's output will be low and the transistor will be turned off.

In this way, the pattern of configuration data that is loaded into elements 20 configures the programmable logic of circuits 16 to perform desired custom functions. Programmable logic circuitry that may be customized by the configuration data loaded into programmable memory elements 20 includes pass transistors, parts of multiplexers (e.g., multiplexers used for forming routing paths in programmable interconnects 24), look-up tables, logic arrays, AND, OR, NAND, and NOR logic gates, etc.

Blocks 16 may be connected using global and local interconnects. Buses such as bus 24 may be formed from groups of conductive lines that span all or most of the width of integrated circuit 12. The lines of bus 24 may therefore represent a type of global interconnect. Local interconnects may be used, for example, to interconnect adjacent logic blocks 16. For example, local interconnects 18 may be used to connect each logic block 16 in a row of logic blocks 16 to a successive block (i.e., interconnects 18 may serve as direct block-to-block connections). Local interconnects 18 may include one or more lines and may be used to convey signals such as carry signals and other signals between blocks.

Scan chains (e.g., scan chains that are compliant with the well-known JTAG standard or other suitable scan chains) may be formed by adjusting switching circuitry within integrated circuit 12 to interconnect chains of registers 22 within blocks 16 and other circuitry on integrated circuit 12. Scan chains may be used to load test data onto particular nodes of circuit 12. Scan chains may also be used to capture and unload corresponding test results from integrated circuit 12. Scan chains may be accessed using one or more test pins in input-output pins 14. Other pins 14 may also be used in applying test signals to circuit 12 and in monitoring corresponding test results.

Test generation tools 26, tester 30, design tools 34, and programmer 38 may be implemented using computing equipment such as one or more computers. These computers may be linked by a communications network (e.g., a local area network, wide area networks such as the internet, etc.). Databases may be used to store data such as tester files, test results, configuration data files, etc. Databases and other storage may be implemented using computers or using separate storage media or storage appliances.

Figure 2:
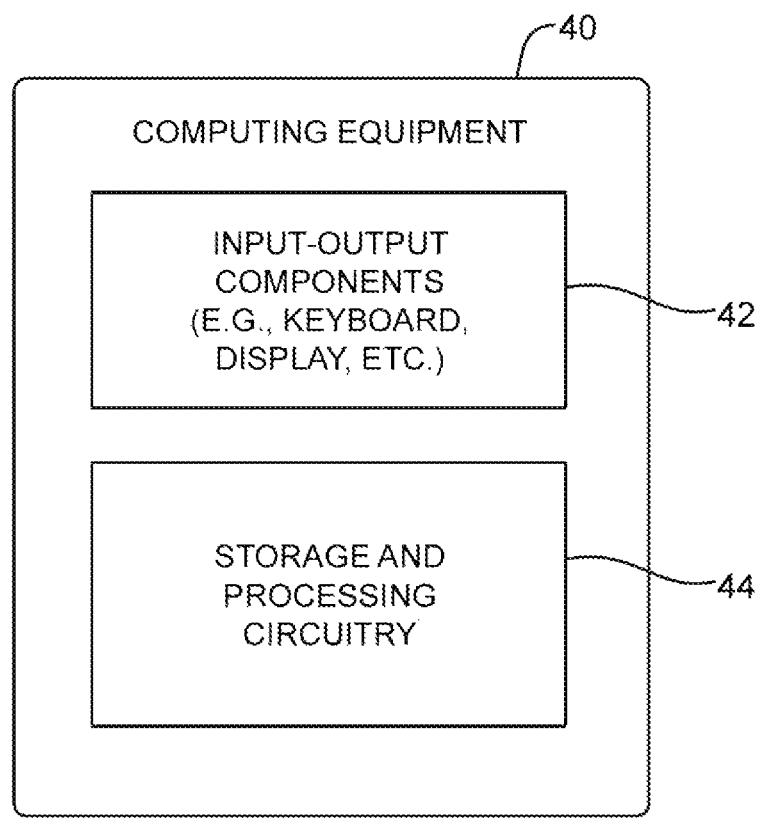
FIG. 2 is a diagram of illustrative computing equipment that may be used in implementing computer-aided-design (CAD) tools such as test generation tools in accordance with an embodiment of the present invention.

FIG. 2 illustrates the type of computing equipment that may be used in processing and storing data in system 10. As shown in FIG. 2, computing equipment 40 may include input-output components 42 and storage and processing circuitry 44. Input-output components 42 may include keyboards, mice, and other data input components that allow users to supply input. Input-output components 42 may also include displays and other components that allow data to be presented to a user. Storage and processing circuitry 44 may include microprocessors and other processing circuitry. Storage and processing circuitry 44 may also include solid state drives, hard disk drives, random-access memory, and other volatile and nonvolatile storage devices. The components of computing equipment 40 may be used to implement the features of the tools of FIG. 1 and may be located at one or more physical locations.

In a typical scenario, several computers are used to implement different portions of test generation tools 26 and tester files 28 are stored in a database. Tester 30 may include a computer that is coupled to integrated circuit 12 using a test probe or a socket that receives a packaged integrated circuit. Test results may be stored in database 32. Design tools 34 may be implemented using one or more computers. For example, one computer may be used for design entry and other computers may be used to analyze designs. Other types of arrangements may be used if desired. This typical scenario is merely illustrative.

Figure 3:
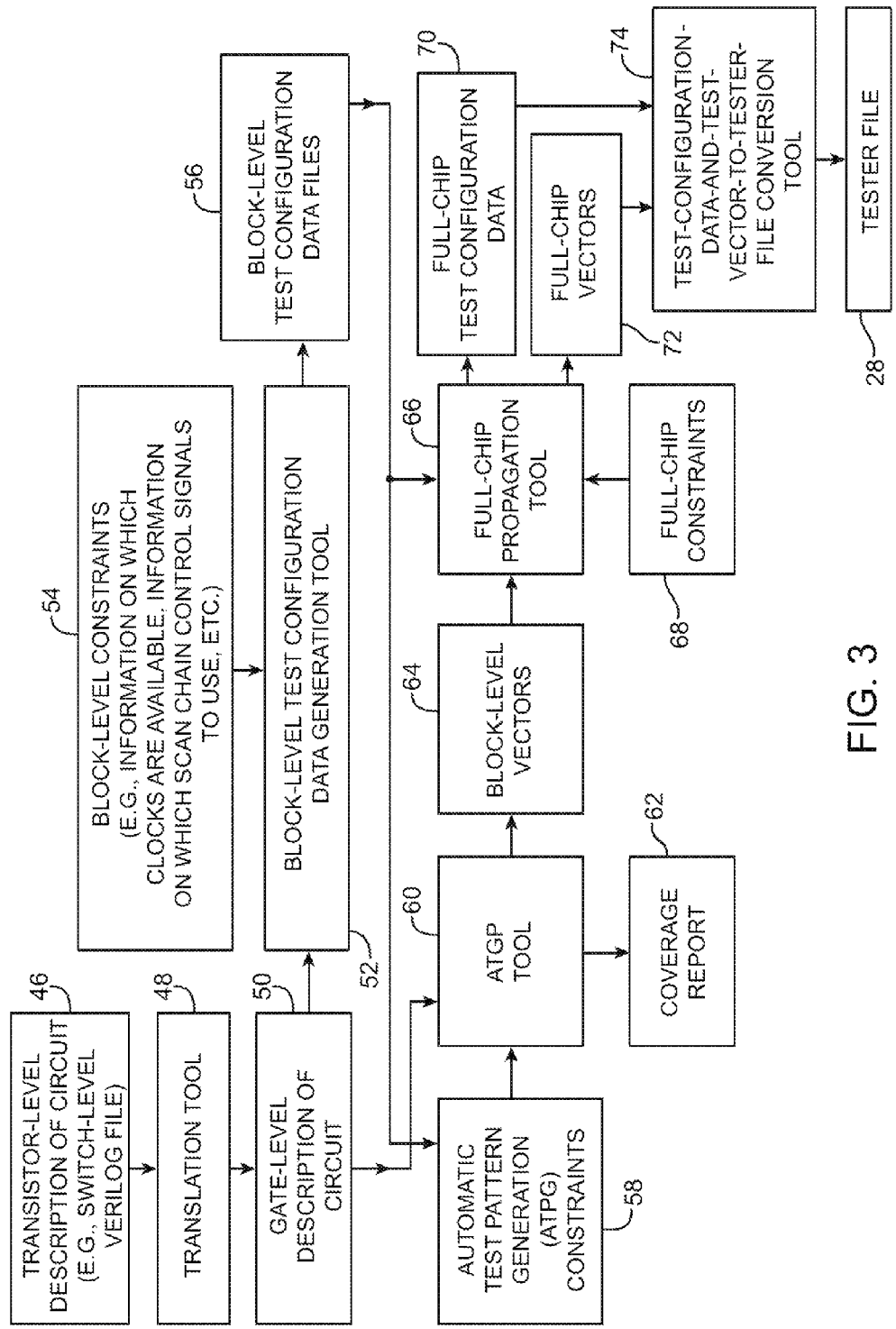
FIG. 3 is a diagram showing how test generation tools may be used to automatically generate test patterns for testing integrated circuits such as programmable integrated circuits in accordance with an embodiment of the present invention.

An illustrative implementation of test generation tools 26 of FIG. 1 is shown in FIG. 3. In the arrangement shown in FIG. 3, the test generation tools include translation tool 48, block-level test configuration data generation tool 52, automatic test pattern generation tool 60, full-chip propagation tool 66, and test-configuration-data-and-test-vector-to-tester-file conversion tool 74. This is merely illustrative. Other collections of tools may be used to implement test generation tools 26 of FIG. 1 if desired. The arrangement of FIG. 3 is described herein as an example.

The tools of FIG. 3 may be used to automatically produce tester file 28 from a transistor-level circuit design such as transistor-level circuit description 46.

Transistor-level circuit description 46 may contain design specifications for a programmable integrated circuit (e.g., a programmable logic device such as a field-programmable gate array or other device with programmable circuitry) in any suitable format. With one illustrative arrangement, transistor-level circuit description 46 may be provided in the form of a hardware description language file such as a Verilog file. Tools such as tools 34 or other circuit design tools may produce description 46.

Transistor-level circuit description 46 specifies how each conductive line and transistor terminal is interconnected on integrated circuit 12. This low-level description of integrated circuit 12 may be abstracted into a higher-level description such as gate-level description 50 using transistor-level-description-to-gate-level-description translation tool 48. Translation tool 48 may run on a Linux platform on a personal computer or on other suitable computing equipment (e.g., computing equipment 40 of FIG. 2). Translation tool 48 converts the transistor-level representation of integrated circuit 12 that is present in file 46 into the gate-level representation of integrated circuit 12 that is present in file 50. For example, if an inverter is represented as series-connected n-channel and p-channel metal-oxide semiconductor transistors in file 46, in file 50, these two transistors will be represented at the gate level (i.e., as an inverter) without reference to the constituent transistors within the inverter gate. Gate-level description 50 may be provided in the form of a hardware description language file such as a Verilog file. Complex connections such as feedback loops may be represented as proper gate-level modules using this file.

Block-level test configuration data tool 52 receives gate-level description 50 and block-level constraints 54 as inputs and produces block-level test configuration data files 56 as an output. Block-level test configuration data generation tool 52 may run on a Windows® platform on a personal computer or on other suitable computing equipment (e.g., computing equipment 40 of FIG. 2). Block-level test configuration data generation tool 52 produces test configuration data corresponding to block level circuitry (e.g., logic circuit blocks 16 of FIG. 1). Block-level constraints 54 provide tool 52 with information on which clocks are available in integrated circuit 12, which scan chain control signals to use to control scan chain registers 22 (FIG. 1) during tests, and other constraint information.

Integrated circuit 12 may have a clock selection multiplexer that is controlled by one or more configuration bits (i.e., configuration data loaded into a set of one or more programmable elements 20). The multiplexer may receive various different clock signals at respective inputs and may provide a circuit block 16 with a selected one of these clocks. The identity of the selected clock is determined by the state of the configuration data associated with the clock selection multiplexer.

A particular integrated circuit 12 may be mounted in a package in which certain clock inputs do not receive valid clock signals. For example, certain pins 14 may not be bonded to integrated circuit 12. When a given pin is not bonded, the clock signal that would otherwise be provided using the given pin is not available. As a result of package-specific arrangements such as these, some of the clock inputs of a clock selection multiplexer on the integrated circuit will not receive valid clock signals. It will therefore not be possible to configure the clock selection multiplexer to provide certain clock signals. Information on which clock signals are available and which clocks are not available can be specified by including appropriate clock constraint information within block-level constraints 54. Constraints that reflect which scan chain features are available in integrated circuit 12 can likewise be included within block-level constraints 54.

Gate-level description 50 and block-level constraints 54 are processed by block-level test configuration data generation tool 52 to produce corresponding block-level test configuration data files 56. During testing, test configuration data is loaded into integrated circuit 12 to configure integrated circuit 12 for testing. For example, test configuration data may be loaded into integrated circuit 12 that routes a desired clock from one of the clock inputs of a clock selection multiplexer to its output. If the test configuration data is not loaded into integrated circuit 12, integrated circuit 12 will generally not function properly and cannot be tested. Tool 52 uses knowledge of the gate-level design of integrated circuit (from file 50) and information on the available clocks, etc. (from block-level constraints 54) to produce test configuration data 56 suitable for placing circuit blocks 16 into a variety of configurations during tests. The block-level test configuration data files can specify the functionality of circuit blocks that have been automatically generated to facilitate testing for those blocks. The block-level test configuration data files also specify which direct block-to-block connections will be used during full-chip testing.

Tool 52 may, for example, produce about 5-20 block-level test configuration data files corresponding to a given circuit block 16 (FIG. 1). If there are N available clock inputs for a circuit block, tool 52 may generate at least N different configuration data files each of which may have corresponding configuration bits that route a different corresponding clock signal to the circuit block. In this way, the performance of the circuit block when clocked with each of the N different clock paths may be evaluated. Block-level test configuration data files 56 may be provided using any suitable file format (e.g., *.pof or *.sof files).

Automatic test pattern generation tool 60 may be implemented using a conventional commercially-available ATPG tool of the type that is otherwise used for automatically generating test patterns for custom hardwired integrated circuits (i.e., for application-specific integrated circuits) or may be implemented using a non-standard tool arrangement. Automatic test pattern generation tool 60 may run on a Linux platform on a personal computer or on other suitable computing equipment (e.g., computing equipment 40 of FIG. 2). Tool 60 may generate block-level test vectors 64 corresponding to circuit blocks 16. Block-level vectors 64 include a collection of test input vectors and a collection of corresponding test output vectors. The input vectors represent test signals that are supplied to a block of circuitry 16. The output vectors represent expected output values corresponding to the input vectors.

As a simplified example, consider the testing of a circuit block that contains an inverter. A given test input vector for the circuit block might include a logic one that is to be supplied to the input of the inverter. A test output vector for this example would include a logic zero value corresponding to the expected output of the inverter when the circuit block is provided with the given test input vector. Test vectors may be conveyed to and from circuit blocks on integrated circuit 12 using input-output pins 14 (FIG. 1) and scan chain registers 22.

ATPG tools such as tool 60 generate block-level vectors 64 based on automatic test pattern generation constraints 58 and description 50. In particular, tool 60 may use information from gate-level description 50 (e.g., information specifying that a clock selection multiplexer has a particular number of inputs) and constraint information from block-level test configuration data files 56 (e.g., information specifying which clocks and scan chains are available given that the integrated circuit is mounted in a particular type of integrated circuit package). There may be a separate block-level test configuration data file 56 and a corresponding set of ATPG constraints 58 for each of the different test configurations that is produced by block-level test configuration data generation tool.

ATPG tool 60 may analyze constraints 58 to estimate how thoroughly integrated circuit 12 has been tested and may generate a corresponding coverage report such as report 62. Report 62 may include, for example, a list of various types of tested faults and corresponding estimates of test coverage (e.g., 99.2% of stuck-at faults are estimated to have been covered, 90.4% of transition faults are estimated to have been covered, etc.). Report 62 (and the other data files used by the tools of FIG. 3) may be stored in storage within storage and processing circuitry 44 (FIG. 2).

Block-level vectors 64 represent test inputs and outputs at the block level (i.e., at the level of an individual circuit block 16 in FIG. 1). Similarly, block-level test configuration data files 56 contain test configuration data bits at the block level (i.e., bits that may be used to configure one of blocks 16 of FIG. 1 for tests). To test integrated circuit 12 effectively, full-chip propagation tool 66 converts block-level test configuration data files 56 into full-chip test configuration data file 70 and converts block-level vectors 64 into full-chip test vectors 72. Full-chip propagation tool 66 may run on a Windows® platform on a personal computer or on other suitable computing equipment (e.g., computing equipment 40 of FIG. 2). Tool 66 creates full-chip test configuration data 70 and full-chip vectors 72 using block-level vectors 64, block-level test configuration data files, and full-chip constraints 68 as inputs. Full-chip constraints may include constraint information that applies globally to the circuitry of integrated circuit 12. Examples of global constraints include maximum chip power consumption, maximum bus lengths, recommended or required groupings of circuit blocks 16 (e.g., preferred groupings of logic array blocks), etc.

During processing of block-level vectors 64 and block-level test configuration data files 56, tools 66 can create test configuration data that covers all of the circuitry of a full integrated circuit (i.e., a full "chip"). If, for example, there are 100 blocks 16 on integrated circuit 12, block-level test configuration data from files 56 may be replicated 100 times using tool 66 to produce full-chip test configuration data 70. Tool 66 may perform this replication operation for each different block-level test configuration data file 56. For example, if there are seven different block-level test configuration data files 56, full-chip propagation tool 66 may produce seven corresponding full-chip test configuration data files 70. Full-chip vectors 72 include input vectors and expected output vectors for integrated circuit 12 that have likewise been constructed based on smaller block-level vectors 64. The output vectors may correspond to test response data that is captured at the periphery of integrated circuit 12 (i.e., using pins 14) and/or test response data that is captured internally (e.g., within a scan chain formed from registers 22). Full-chip vectors 72 may, for example, include output vectors that represent the data values that are expected within one or more scan chains that run through integrated circuit 12 (i.e., full-chip scan chain test output vectors).

Each full-chip test configuration data file 70 that is produced by tool 66 specifies which pattern of programmable interconnects on programmable integrated circuit 12 (e.g., which set of programmed interconnects 24 of FIG. 1) will satisfactorily route the full-chip test vectors to desired circuit blocks 16. Consider, as an example, a situation in which each block 16 has a clock input that must receive a clock signal to function properly (whether for a test or during normal operation). When full-chip test configuration data file 70 is created, the configuration bits in file 70 will include clock selection multiplexer settings that are needed to route a valid clock signal to each block 16. If different clocks rates are to be tested, tool 66 may create multiple full-test configuration data files 70 each of which contains configuration bit settings for selecting a clock at a different respective clock rate. Each of the different clock rates may be used in clocking blocks 16 during a different respective test.

In conjunction with the process of creating full-chip test configuration data files 70, full-chip propagation tool 66 creates corresponding full-chip vectors 72. Some types of chip-level tests involve the generation of signals in one block 16 that are captured by another block 16. A block 16 that is being tested in this way serves as a circuit-under-test, whereas the block that is capturing the resulting output signals from the first block is serving as an observation block. Tests of this type can be handled at the chip level by testing one half of the blocks (i.e., the "odd numbered" blocks) while capturing resulting output signals from these blocks using another half of the blocks (i.e., the "even numbered" blocks). The blocks that are being tested and the blocks that are serving as observation blocks may then reverse roles (i.e., so that data from the even numbered blocks is captured by the odd numbered blocks).

When half of the logic blocks 16 on the chip serve as circuits under test while the other half serve as observation blocks, full test coverage can be accomplished by doubling the number of tests that are run. For example, if five block-level test configuration data files 56 are produced by tool 52 and an odd/even block role reversal scheme is required to fully test integrated circuit 12, tool 66 could generate ten corresponding full-chip test configuration data files and ten corresponding sets of full-chip vectors 72 (as an example). When testing some integrated circuit designs, it may be desirable to divide a test into subparts. For example, it may be desirable to test each of four quadrants in an integrated circuit individually when buses within the integrated circuit span no more than a quarter of the integrated circuit, when power constraints limit the amount of circuitry that can be tested at one time to less than a quarter of a chip, etc.

The presence of direct connections between respective circuit blocks 16 can be leveraged during tests. For example, direct block-to-block connects between adjacent blocks 16 such as a carry signal line or other direct path may be used to provide test signals from one block to another block. In this type of scenario, block-level test configuration data generation tool 52 can automatically generate block-level test configuration data files that specify which direct block-to-block connections will be used during full-chip testing. The block-level test configuration data files can also specify the functionality of the blocks that have been automatically generated to allow for easy testing of those blocks. In this way, automatic test pattern generation constraints 58 will be selected so that ATPG tool 60 can model the applied and expected direct path values on the direct path as part of the block-level test inputs and outputs in block-level vectors 64. Full-chip propagation tool 66 may then also account for the direct block-to-block connections (i.e., carry paths and other direct connections such as connection 18 of FIG. 1) when calculating its expected full chip vectors.

As an example, consider a direct path 18 between blocks that is used to convey a Boolean carry signal between logic blocks 16 during normal operation. In a full-chip test, it is expected that this carry value will be propagated along an entire column (or row) of logic blocks 16 (e.g., logic array blocks in a field-programmable gate array integrated circuit or other programmable logic device). By taking account of the simultaneous presence of the carry signal in all blocks 16 in the column during the full-chip test, full-chip propagation tool 66 can generate full-chip test configuration data and full-chip vectors that are suitable for testing a complete integrated circuit 12 (i.e., for performing a full-chip test).

Full-chip test configuration data 70 and full-chip test vectors 72 can be converted into tester file 28 using test-configuration-data-and-test-vector-to-tester-file conversion tool 74. During the conversion process, tool 74 may receive one or more files of full-chip test configuration data 70 and one or more sets of full-chip vectors 72 and may place the test configuration data and test vectors into a suitable file format for subsequent testing using tester 30 (e.g., this information may be incorporated into one or more tester files 28). The tester file 28 that is produced by conversion tool 74 may be stored in a database or other storage (e.g., storage in storage and processing circuitry 44).

As shown in FIG. 1, tester file 28 is received by tester 30. Tester 30 uses tester file 28 in determining which test configuration data is to be loaded into integrated circuit 12 and which test vectors are to be applied to integrated circuit 12 during testing. The test configuration data is loaded into programmable memory elements 20 by tester 30 and thereby configures clock selection multiplexers, programmable logic in blocks 16, interconnection multiplexers, and other programmable logic circuitry in integrated circuit 12 as needed to perform a test.

After integrated circuit 12 has been programmed to implement a desired test circuit configuration in this way, tester 30 may apply corresponding input test vectors to integrated circuit 12 and can gather corresponding output test vectors from integrated circuit 12. Input test vectors can be applied to integrated circuit 12 at pins 14 and by loading input test vectors into scan chains formed from registers 22. Corresponding output test vectors are produced after one or more clock cycles and can be measured at pins 14 and by unloading output test vectors from scan chains formed from registers 22. After each test is completed, tester 30 can load new test configuration data from file 28 into integrated circuit 12 to reconfigure the integrated circuit for a subsequent test. Once testing is completed, tester 30 or test analysis software running on computing equipment separate from tester 30 may analyze the tests and may store corresponding test results data in test results database 32.

The foregoing is merely illustrative of the principles of this invention and various modifications can be made by those skilled in the art without departing from the scope and spirit of the invention.

What is claimed is:

1. A method of testing a programmable integrated circuit that contains multiple blocks of programmable logic circuitry, the method comprising:

with a block-level test configuration data generation tool implemented on computing equipment, during testing of the programmable integrated circuit, generating block-level test configuration data files; and with a full-chip propagation tool implemented on the computing equipment, during the testing of the programmable integrated circuit, generating full-chip test configuration data for testing the programmable integrated circuit from the block-level test configuration data files, wherein each block-level test configuration data file is associated with a given one of the multiple blocks of programmable logic circuitry.

2. The method defined in claim 1 wherein direct block-to-block connections couple at least some blocks of the multiple blocks of programmable logic circuitry on the programmable integrated circuit, wherein generating the block-level test configuration data files comprises automatically generating the block-level test configuration data files for specifying a direct block-to-block connection of the direct block-to-block connections for use during full-chip testing.

3. The method defined in claim 1 further comprising:
with an automatic test pattern generation tool implemented on the computing equipment, generating block-level test vectors.

4. The method defined in claim 3, wherein generating the block-level test vectors comprises generating the block-level test vectors at least partly using the block-level-test configuration data files as automatic test pattern generation constraints.

5. The method defined in claim 3 further comprising:
with the full-chip propagation tool, generating full-chip test vectors at least partly from the block-level test vectors.

6. The method defined in claim 5 wherein generating the full-chip test configuration data and the full-chip test vectors comprises using full-chip constraints in generating the full-chip test configuration data and the full-chip test vectors.

7. The method defined in claim 1 wherein generating the full-chip test configuration data comprises using full-chip constraints in generating the full-chip test configuration data.

8. A system used in testing a programmable integrated circuit that contains a plurality of blocks of programmable logic, the system comprising:
a tool implemented on computing equipment that is operable to automatically produce full-chip test vectors for testing the programmable integrated circuit based on block-level test vectors that are associated with a given one of the plurality of blocks of programmable logic, wherein the tool is further operable to generate full-chip test configuration data for testing the programmable integrated circuit from block-level test configuration files, wherein each block-level test configuration file is associated with a given one of the plurality of blocks of programmable logic; and
a block-level test configuration data generation tool implemented on the computing equipment that is operable to produce the block-level test configuration data files during testing of the programmable integrated circuit.

9. The system defined in claim 8 further comprising:
an automatic test pattern generation tool implemented on the computing equipment that is operable to produce the block-level test vectors.

10. The system defined in claim 9, wherein the automatic test pattern generation tool is configured to produce the block-level test vectors based on automatic test pattern generation constraints and wherein the automatic test pattern generation constraints include information from the block-level test configuration data files.

11. The system defined in claim 8 further comprising a tester that is operable to receive the full-chip test configuration data from the tool.

12. The system defined in claim 11 wherein the tester is configured to receive the full-chip test vectors from the tool.

13. A method of testing a programmable integrated circuit that contains programmable logic blocks, said method comprising:
with computing equipment, during testing of the programmable integrated circuit, receiving block-level test vectors from an automatic test pattern generation tool, wherein the block-level test vectors include programmable logic block input test vectors and programmable logic block output test vectors associated with a given one of the programmable logic blocks;
with the computing equipment, during the testing of the programmable integrated circuit, generating block-level test configuration data files; and
with the computing equipment, during the testing of the programmable integrated circuit, automatically generating full-chip test configuration data for loading into the programmable logic blocks on the integrated circuit during testing of the integrated circuit from the block-level test configuration data files and automatically generating full-chip test vectors for testing the programmable logic blocks contained on the integrated circuit based at least partly on the received block-level test vectors.

14. The method defined in claim 13 further comprising:
with a translation tool implemented on the computing equipment, translating a transistor-level description of circuitry on the programmable integrated circuit into a gate-level description of the circuitry.

15. The method defined in claim 14,
wherein generating block-level test configuration data files comprises, with a block-level test configuration data generation tool implemented on the computing equipment, receiving the gate-level description of the circuitry and generating corresponding block-level test configuration data files.

16. The method defined in claim 15 further comprising:
with the block-level test configuration data generation tool, receiving block-level constraints, wherein generating the block-level test configuration data files further comprises using the block-level constraints in generating the block-level test configuration data files.

17. The method defined in claim 16 further comprising:
with a test-configuration-and-test-vector-to-tester-file conversion tool, converting the full-chip test configuration data and the full-chip test vectors into a tester file.

18. The method defined in claim 17 further comprising:
with a tester, using the tester file to test the programmable integrated circuit.

19. The method defined in claim 13 wherein the computing equipment is configured to automatically produce the full-chip test configuration data and the full-chip test vectors using full-chip constraints for the programmable integrated circuit that are selected from the group consisting of: a maximum power consumption for the programmable integrated circuit, a maximum bus length for the programmable integrated circuit, and a constraint on grouping of the programmable logic blocks on the programmable integrated circuit.

* * * * *